United States Patent [19]

Lu

[11] Patent Number: 5,486,780
[45] Date of Patent: Jan. 23, 1996

[54] TRI-STATEABLE CURRENT MIRROR SENSE AMPLIFIER

[75] Inventor: Hsindao Lu, Richardson, Tex.

[73] Assignee: Texas Instruments Inc., Dallas, Tex.

[21] Appl. No.: 325,768

[22] Filed: Oct. 19, 1994

[51] Int. Cl.$^6$ .................................. H03F 3/45; G06G 7/12
[52] U.S. Cl. ........................ 327/53; 327/66; 327/185; 327/563; 326/57; 365/208
[58] Field of Search ................... 327/51, 53, 52, 327/65, 66, 185, 560, 561, 562, 563, 63, 64; 326/56, 57; 365/208

[56] References Cited

U.S. PATENT DOCUMENTS

| | | | |
|---|---|---|---|
| 4,309,630 | 1/1982 | Young, Jr. | 326/57 |
| 4,410,858 | 10/1983 | Kusakabe | 327/66 |
| 4,791,324 | 12/1988 | Hodapp | 327/53 |
| 5,034,636 | 7/1991 | Reis et al. | 327/52 |
| 5,229,666 | 7/1993 | Sandhu | 327/51 |

*Primary Examiner*—Timothy P. Callahan
*Assistant Examiner*—Terry Englund
*Attorney, Agent, or Firm*—William B. Kempler; Wade James Brady, III; Richard L. Donaldson

[57] ABSTRACT

A tri-stateable sense amplifier, for driving a bus directly with minimal size devices, includes a control transistor coupled to a reference voltage terminal and having a control electrode receiving a first control signal. A first series circuit includes a first transistor of a first channel type and a second transistor of opposite channel type coupled between the control transistor and a supply voltage terminal. A control electrode of the second transistor receives a first input signal and the second transistor generates a first output signal. A second series circuit includes a third transistor of the first channel type and a found transistor of the opposite channel type coupled between the control transistor and the supply terminal. A second input signal is coupled to the control electrode of the fourth transistor. A fifth transistor of the first channel type is coupled between the voltage supply terminal and the control electrodes of the first channel type transistors and has a control electrode coupled to receive a second control signal. A sixth transistor of the first channel type is coupled between the control electrodes of the first channel type transistors and a junction of the third and fourth transistors and has a control electrode coupled to receive a third control signal.

16 Claims, 1 Drawing Sheet

TRI-STATEABLE CURRENT MIRROR SENSE AMPLIFIER

BACKGROUND OF THE INVENTION

1. Field of the Invention

This invention relates to a current mirror sense amplifier and, more specifically, to a current mirror sense amplifier having a tri-state output.

2. Brief Description of the Prior Art

In a random access memory (RAM) that uses x8 or higher architecture, it is often necessary to share the data buses between input and output to reduce the number of buses in the circuit. Sharing of buses between input and output requires that the circuit sense amplifier be truly tri-state during the WRITE operation. Normally, this requirement is accomplished by using a pass gate between the sense amplifier and the data buses to isolate the output of the sense amplifier from the buses during a WRITE operation when data is being applied to the data buses by the input data driver. In such circuits, where the data bus is long, it is necessary to use large pass gates between the current mirror and the data buses. The pass gates are generally large in order to drive the data buses adequately and therefore take up a great deal of chip real estate. It is therefore desirable that the pass gates be eliminated.

SUMMARY OF THE INVENTION

In accordance with the present invention, there is provided a tri-stable current mirror sense amplifier wherein the sense amplifier drives the data bus directly with minimal size devices, thereby saving a substantial amount of real estate on the chip.

Briefly, the above is accomplished by providing a sense amplifer having a voltage supply terminal and a reference voltage terminal with a control transistor coupled to reference voltage terminal. First, second, third and fourth series circuits, each including a first transistor of a first channel type and a second transistor of opposite channel type are coupled between the control transistor and the voltage supply terminal. One of first and second transistors of the first channel type is coupled between the voltage supply terminal and the control electrodes of the first channel type transistors of the first and second series circuits, the other of the first and second transistor is coupled between the voltage supply terminal and the control electrodes of the first channel type transistors of the third and fourth series circuits. One of third and fourth transistors of the first channel type is coupled between the control electrodes of the first channel type transistors of the first and second series circuits and the junction of the transistors of the second series circuit and the other of said third and fourth transistors is coupled between the control electrodes of the first channel type transistors of the third and fourth series circuits and the junction of the transistors of the fourth series circuit. Preferably, the first channel type is P-channel and the opposite channel type is N-channel. The control transistor is of the opposite channel type. The control transistor structure preferably comprises a transistor coupled between the first and second series circuits and the reference voltage terminal and a transistor coupled between the third and fourth series circuits and the reference terminal.

DESCRIPTION OF THE PREFERRED EMBODIMENT

Figure 1:
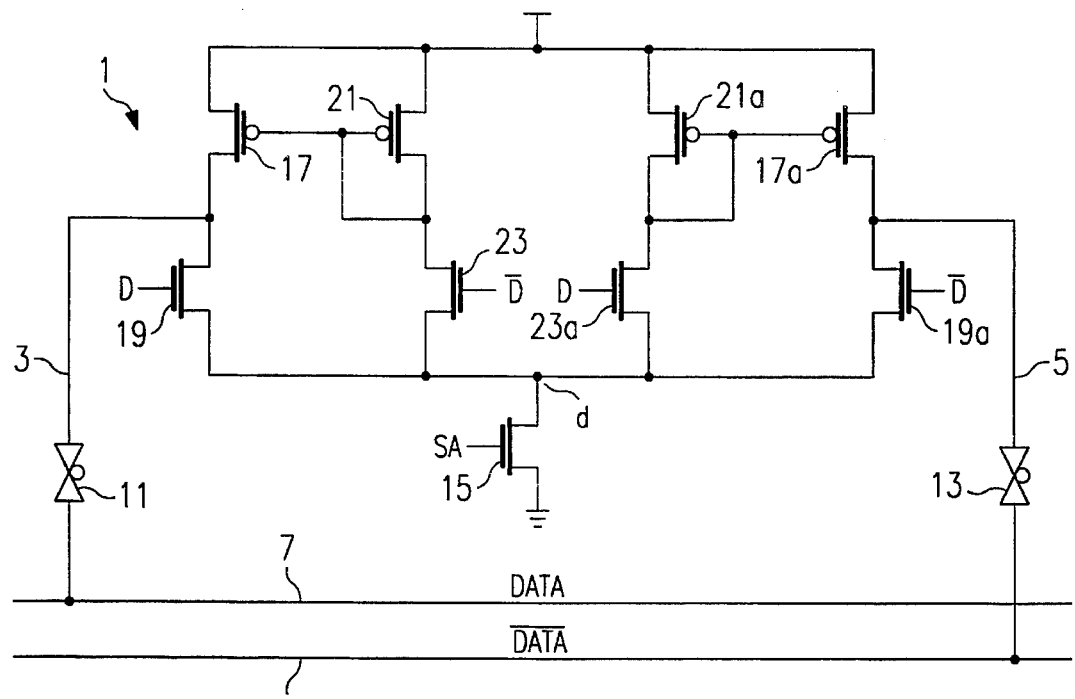
FIG. 1 is a circuit diagram of a sense amplifier in accordance with the prior art.

Referring first to FIG. 1, there is shown a prior art current mirror sense amplifier circuit 1. The sense amplifier circuit 1 includes a pair of I/O terminals 3 and 5 which are coupled to a DATA bus 7 and a DATA BAR bus 9 respectively through a pair of pass gates 11 and 13. The sense amplifier circuitry further includes a pair of identical circuits coupled between the voltage supply and an N-channel sense amplifier control transistor 15 at node d, transistor 15 being controlled by a sense amplifier control signal, SA, at the gate thereof and coupled to ground or reference voltage. Each of the identical circuits includes a first circuit path between the voltage supply and control transistor 15 including a P-channel transistor 17, 17a in series with an N-channel transistor 19, 19a with terminals 3 and 5 coupled to the junctions of transistors 17–19 and 17a–19a respectively. A second circuit path between the voltage supply and control transistor 15 includes a P-channel transistor 21, 21a having its gate and drain coupled to the gate of transistor 17, 17a and in series with an N-channel transistor 23, 23a. A data signal D from the bit line of an associated RAM is applied to the gates of transistor 19 and 23a and a data bar signal D BAR is applied to the gates of transistors 19a and 23.

In operation, it can be seen that, initially, transistors 17 and 17a can be on or off. If transistors 17 and/or 17a are initially on, there is a current path from the supply to the DATA and/or DATA BAR busses through the transistors 17, 17a and pass gates 11 and 13 through which unwanted leakage currents may travel.

The data D and D BAR signals which are applied to the gates of transistors 19 and 19a are generally very small differential signals on the order of 0.2 to 0.5 volts and are obtained from the bit line of the RAM. When the sense amplifier signal SA is low, transistor 15 is off. Therefore the voltage on the gates of transistors 17, 21, 17a and 21a is high and these transistors are off also. Accordingly, there is no activity at the I/O lines 3 and 5. When SA goes high, transistor 15 is on and provides a low voltage to the drains of transistors 19, 23, 19a and 23a. This turns on transistors 17, 21 when DATA is high and turns on transistors 17a and 21a when DATA BAR is high. Accordingly, a positive data signal on the gates of transistors 19, 23, 19a and 23a will turn on those transistors and place line 3 or 5 at the supply voltage less one $V_t$ through transistor 17 or 17a whereas the other of lines 3 and 5 at a low voltage via the pass gates 11 and 13.

Figure 2:
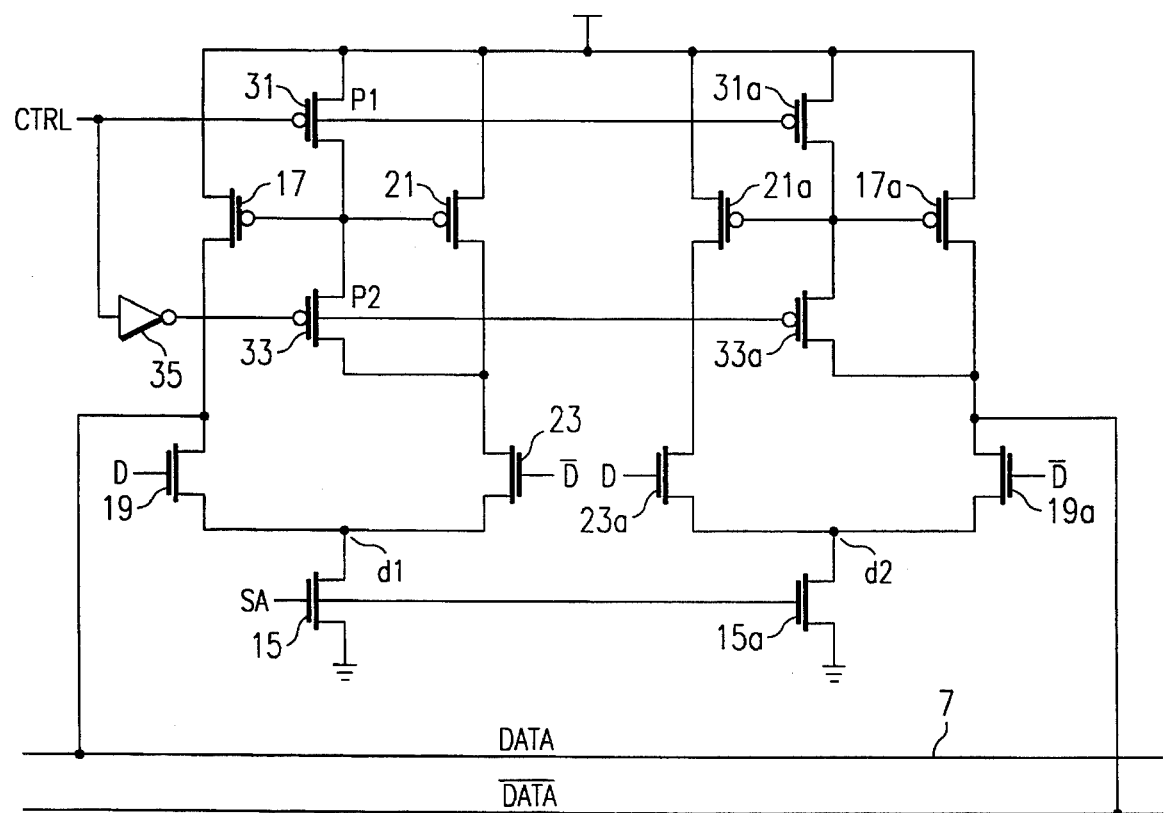
FIG. 2 is a tri-stated sense amplifier in accordance with the present invention.

Referring now to FIG. 2, there is shown a tri-stated sense amplifier in accordance with the present invention wherein the pass gates 11 and 13 of FIG. 1 have been eliminated. This circuit is identical with the circuit of FIG. 1 except for the addition in each portion of the circuit of a P-channel transistor 31, 31a between the supply and the gates of transistors 17, 21 and 17a, 21a, respectively and a P-channel transistor 33, 33a between the gates of transistors 17, 21 and 17a, 21a and the junction of transistors 21, 23 and 17a, 19a, respectively. The transistors 31, 31a are controlled by a control signal CTRL at the gates thereof and the transistors 33, 33a are controlled by the inverse of the CTRL signal on the gates thereof since the CTRL signal passes through an inverter 35 prior to arrival of the gates of transistors 33 and 33a. In addition, the control transistor 15 has been replaced by a pair of control transistors 15, 15a which are both controlled by the same SA signal and can occupy the same space on the chip in combination as the transistor 15 of FIG. 1, however the two portions of the circuit are isolated from each other due to the use of two control transistors. This provides the advantage that nodes d1 and d2 are isolated so current cannot travel from node d1 to node d2 or vice versa. In other words, current cannot pass between the left and right loops.

This circuit operates in the same manner as discussed above with regard to FIG. 1. However, in addition, by turning on or off the transistors 31, 31a and 33, 33a in the current mirror load, the sense amplifier is placed into the active mode or tri-stated mode along with the sense amplifier control signal (SA). The CTRL signal and the sense amplifier control signal (SA) are provided by the same source. When SA is low, CTRL is low and when SA is high, CTRL is high.

When both the sense amplifier input (gate of the sense amplifier 15) SA and control signal (CTRL) are high, the sense amplifier is enabled, transistors 31, 31a are turned off and isolate the gates of transistors 17, 17a and 21, 21a from the voltage supply. Since the voltage supply is isolated from the gates of transistors 17, 17a and 21, 21a and transistors 33, 33a and 15 are turned on, a ground or reference voltage is placed at the drains of transistors 19, 19a, thereby making the sense amplifier function in standard manner.

When the SA signal and the CTRL signal are both low, transistors 31, 31a are on and transistors 33, 33a are off. Therefore, transistors 17, 17a, 21 and 21a are off, power from the output nodes is cut off and the circuit is made completely tri-stated and the operational circuit is the same as in FIG. 1 without the requirement of the pass gates 11 and 13. More specifically, under these conditions, transistors 31 and 31a are turned on and transistors 33 and 33a are turned off. This raises the voltage at the gates of transistors 17, 17a and 21, 21a toward the supply voltage and turns off transistors 17, 17a, 21 and 21a. Accordingly, leakage current will not flow from the supply to the DATA and DATA BAR buses 7 and 9.

In addition, the added transistors 31, 31a, 33, 33a and inverter 35 can be designed to take up much less room than was required for the pass gates 11 and 13 as required in the prior art as demonstrated in FIG. 1. Furthermore, the drive strength required to drive the buses 7 and 9 without the pass gates is diminished due to the losses inherent in the pass gates, thereby further diminishing the required size of the components of sense amplifier.

It should be understood that while the circuit herein has been described with respect to particular P-channel and N-channel transistors, the circuitry can be altered with, for example, the P-channel transistors replaced by N-channel transistors and the N-channel transistors replaced by P-channel transistors with appropriate changes in the circuitry to accommodate such changes.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A sense amplifier which comprises:

(a) a voltage supply terminal and a reference voltage terminal;

(b) a control transistor coupled to said reference voltage terminal and having a control electrode for receiving a first control signal;

(c) a first series circuit including a first transistor of a first channel type and a second transistor of opposite channel type coupled between said control transistor and said voltage supply terminal, said second transistor generating a first output signal and having a control electrode for receiving a first input signal; and (d) a second series circuit including a third transistor of said first channel type and a fourth transistor of said opposite channel type coupled between said control transistor and said voltage supply terminal, said fourth transistor having a control electrode for receiving a second input signal;

(e) a fifth transistor of said first channel type coupled between said voltage supply terminal and control electrodes of said first channel type transistors and having a control electrode for receiving a second control signal; and (f) a sixth transistor of said first channel type coupled between said control electrodes of said first channel type transistors and a junction of said third and fourth transistors and having a control electrode for receiving a third control signal.

2. The sense amplifier of claim 1 wherein said first channel type is P-channel and said opposite channel type is N-channel.

3. The sense amplifier of claim 1 wherein said control transistor is of said opposite channel type.

4. The sense amplifier of claim 2 wherein said control transistor is N-channel type.

5. The sense amplifier of claim 1 further including:

(g) a third series circuit including a seventh transistor of said first channel type and an eighth transistor of said opposite channel type coupled between said control transistor and said voltage supply terminal, said eighth transistor generating a second output signal and having a control electrode for receiving said second input signal;

(h) a fourth series circuit including a ninth transistor of said first channel type and a tenth transistor of said opposite channel type coupled between said control transistor and said voltage supply terminal said tenth transistor having a control electrode for receiving said first input signal;

(i) an eleventh transistor of said first channel type coupled between said voltage supply terminal and control electrodes of said seventh and ninth transistors and having a control electrode for receiving said second control signal; and (j) a twelfth transistor of said first channel type coupled between said control electrodes of said seventh and ninth transistors and a junction of said seventh and eighth transistors and having a control electrode for receiving said third control signal.

6. The sense amplifier of claim 2 further including:

(g) a third series circuit including a seventh transistor of said first channel type and an eighth transistor of said opposite channel type coupled between said control transistor and said voltage supply terminal said eighth transistor generating a second output signal and having a control electrode for receiving said second input signal;

(h) a fourth series circuit including a ninth transistor of said first channel type and a tenth transistor of said opposite channel type coupled between said control transistor and said voltage supply terminal said tenth transistor having a control electrode for receiving said first input signal;

(i) an eleventh transistor of said first channel type coupled between said voltage supply terminal and control electrodes of said seventh and ninth transistors and having a control electrode for receiving said second control signal; and (j) a twelfth transistor of said first channel type coupled between said control electrodes of said seventh and ninth transistors and a junction of said seventh and eighth transistors and having a control electrode for receiving said third control signal.

7. The sense amplifier of claim 3 further including:

(g) a third series circuit including a seventh transistor of said first channel type and an eighth transistor of said opposite channel type coupled between said control transistor and said voltage supply terminal said eighth transistor generating a second output signal and having a control electrode for receiving said second input signal;

(h) a fourth series circuit including a ninth transistor of said first channel type and a tenth transistor of said opposite channel type coupled between said control transistor and said voltage supply terminal said tenth transistor having a control electrode for receiving said first input signal;

(i) an eleventh transistor of said first channel type coupled between said voltage supply terminal and control electrodes of said seventh and ninth transistors and having a control electrode for receiving said second control signal; and (j) a twelfth transistor of said first channel type coupled between said control electrodes of said seventh and ninth transistors and a junction of said seventh and eighth transistors and having a control electrode for receiving said third control signal.

8. The sense amplifier of claim 4 further including:

(g) a third series circuit including a seventh transistor of said first channel type and an eighth transistor of said opposite channel type coupled between said control transistor and said voltage supply terminal said eighth transistor generating a second output signal and having a control electrode for receiving said second input signal;

(h) a fourth series circuit including a ninth transistor of said first channel type and a tenth transistor of said opposite channel type coupled between said control transistor and said voltage supply terminal said tenth transistor having a control electrode for receiving said first input signal;

(i) an eleventh transistor of said first channel type coupled between said voltage supply terminal and control electrodes of said seventh and ninth transistors and having a control electrode for receiving said second control signal; and (j) a twelfth transistor of said first channel type coupled between said control electrodes of said seventh and ninth transistors and a junction of said seventh and eighth transistors and having a control electrode for receiving said third control signal.

9. A sense amplifier which comprises:

(a) a voltage supply terminal and a reference voltage terminal;

(b) control transistor means coupled to said reference voltage terminal and having a control electrode for receiving a first control signal;

(c) first, second, third and fourth series circuits, each series circuit including a first transistor of a first channel type and a second transistor of opposite channel type coupled between said control transistor means and said voltage supply terminal, each of said second transistors having a control electrode for receiving an input signal;

(d) third and fourth transistors of said first channel type, said third transistor being coupled between said voltage supply terminal and the control electrodes of said first channel type transistors of said first and second series circuits, said fourth transistor being coupled between said voltage supply terminal and the control electrodes of said first channel type transistors of said third and fourth series circuits, each of said third and fourth transistors having a control electrode for receiving a second control signal; and (e) fifth and sixth transistors of said first channel type, said fifth transistor being coupled between said control electrodes of said first channel type transistors of said first and second series circuits and a junction of said first and second transistors of said second series circuit and said sixth transistor being coupled between said control electrodes of said first channel type transistors of said third and fourth series circuits and a junction of said transistors of said fourth series circuit, each of said fifth and sixth transistors having a control electrode for receiving a third control signal.

10. The sense amplifier of claim 9 wherein said first channel type is P-channel and said opposite channel type is N-channel.

11. The sense amplifier of claim 9 wherein said control transistor means is of said opposite channel type.

12. The sense amplifier of claim 10 wherein said control transistor means is N-channel type.

13. The sense amplifier of claim 9 wherein said control transistor means comprises a first control transistor coupled between a common node of said first and second series circuits and said reference voltage terminal and a second control transistor coupled between a common node of said third and fourth series circuits and said reference voltage terminal.

14. The sense amplifier of claim 10 wherein said control transistor means comprises a first control transistor coupled between a common node of said first and second series circuits and said reference voltage terminal and a second control transistor coupled between a common node of said third and fourth series circuits and said reference voltage terminal.

15. The sense amplifier of claim 11 wherein said control transistor means comprises a first control transistor coupled between a common node of said first and second series circuits and said reference voltage terminal and a second control transistor coupled between a common node of said third and fourth series circuits and said reference voltage terminal.

16. The sense amplifier of claim 12 wherein said control transistor means comprises a first control transistor coupled between a common node of said first and second series circuits and said reference voltage terminal and a second control transistor coupled between a common node of said third and fourth series circuits and said reference voltage terminal.

* * * * *